United States Patent
Kimmlingen et al.

(10) Patent No.: US 7,230,427 B2
(45) Date of Patent: Jun. 12, 2007

(54) MAGNETIC RESONANCE APPARATUS WITH AN RF ANTENNA UNIT AND A GRADIENT COIL UNIT

(75) Inventors: Ralph Kimmlingen, Nürnberg (DE); Razvan Lazar, Erlangen (DE); Jürgen Nistler, Erlangen (DE); Wolfgang Renz, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/208,185

(22) Filed: Aug. 18, 2005

(65) Prior Publication Data

US 2006/0038566 A1 Feb. 23, 2006

(30) Foreign Application Priority Data

Aug. 18, 2004 (DE) .................... 10 2004 040 062

(51) Int. Cl.
*G01V 3/00* (2006.01)
(52) U.S. Cl. .................................... 324/318
(58) Field of Classification Search .............. 324/318
See application file for complete search history.

(56) References Cited

U.S. PATENT DOCUMENTS

| | | | |
|---|---|---|---|
| 4,680,548 A | 7/1987 | Edelstein et al. | |
| 4,825,162 A | 4/1989 | Roemer et al. | |
| 4,864,241 A | 9/1989 | Goldie | |
| 5,414,360 A | 5/1995 | Westphal et al. | |
| 5,512,828 A | 4/1996 | Pausch et al. | |
| 5,574,372 A | 11/1996 | Moritz et al. | |
| 5,729,141 A | 3/1998 | Hass et al. | |
| 6,297,635 B1 | 10/2001 | Arz et al. | |
| 6,462,636 B1 | 10/2002 | Overweg et al. | |
| 2004/0239327 A1 | 12/2004 | Heid et al. | |
| 2005/0040826 A1 | 2/2005 | Renz et al. | |
| 2005/0073312 A1* | 4/2005 | Heid ........................ | 324/322 |
| 2005/0099183 A1* | 5/2005 | Heid et al. ................. | 324/322 |
| 2005/0258832 A1* | 11/2005 | Eberlein et al. ............ | 324/318 |

* cited by examiner

Primary Examiner—Diego Gutierrez
Assistant Examiner—Megann E. Vaughn
(74) Attorney, Agent, or Firm—Schiff Hardin LLP

(57) ABSTRACT

A magnetic resonance apparatus has an RF antenna unit, a gradient coil unit and an RF shield, the conductor structures of which are independent of one another. The RF shield is arranged between the RF antenna unit and the gradient coil unit, a first RF field return volume is arranged between RF the antenna unit (1, 29, 55A, and the gradient coil unit, the RF field return volume closes RF magnetic field lines of the RF antenna unit and is bordered by the RF shield on the side of the gradient coil unit. The conductor structure of the gradient coil unit occupies a first region. A second conductor-free region is within the first region, on the side facing the RF antenna unit, between a primary gradient coil unit and a secondary shim gradient coil unit of the gradient coil unit. The second conductor-free region is at least partially surrounded by the conductor structure of the gradient coil unit and is fashioned as a second RF field return volume in connection with the first RF field return volume. The RF shield proceeds between the RF field return volumes and the conductor structure of the gradient coil unit. The RF antenna unit is closer to the data acquisition region of the magnetic resonance apparatus than the gradient coil unit.

16 Claims, 5 Drawing Sheets

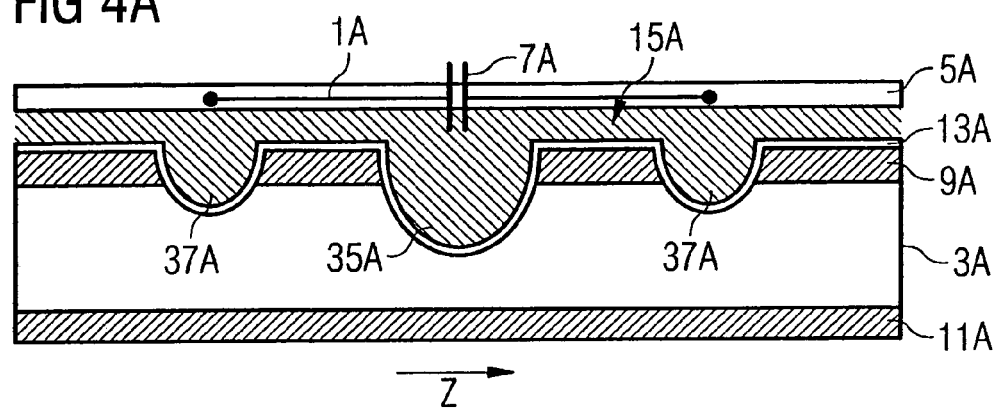
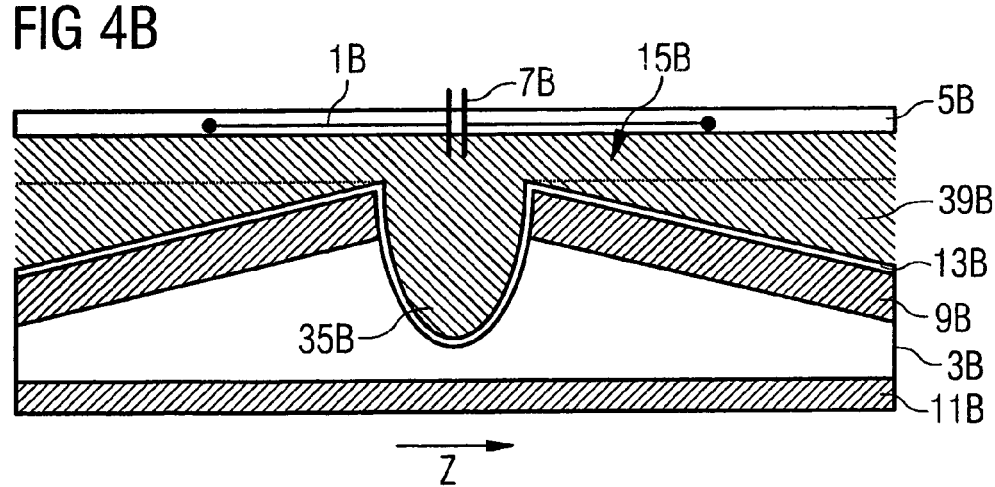

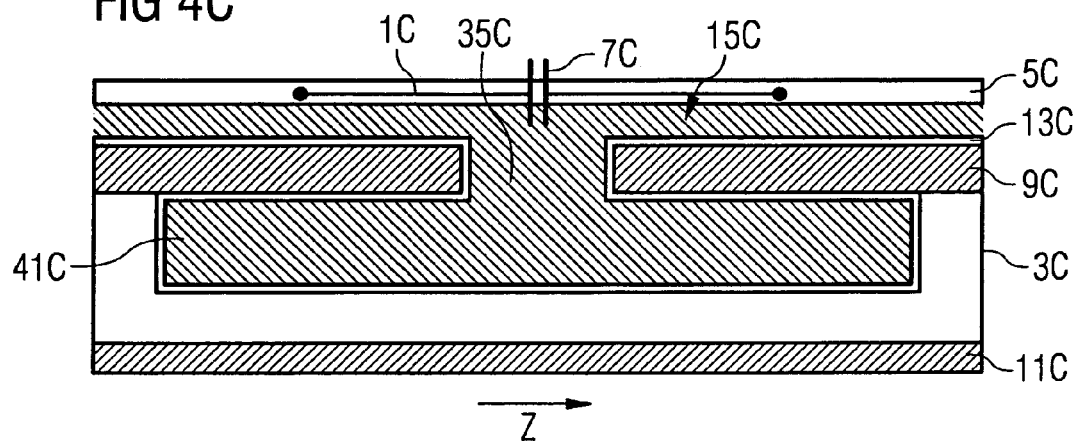
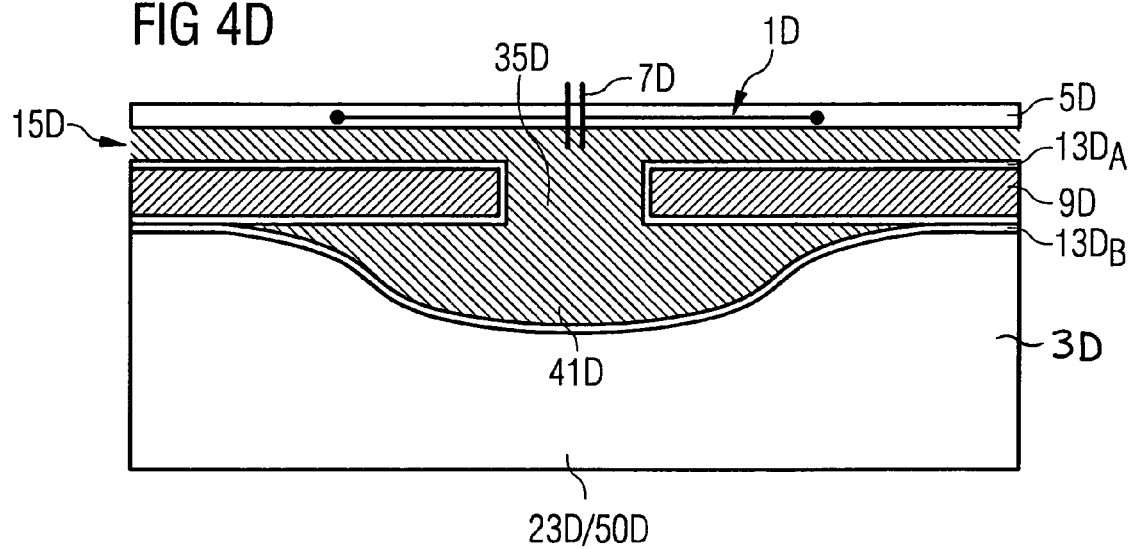

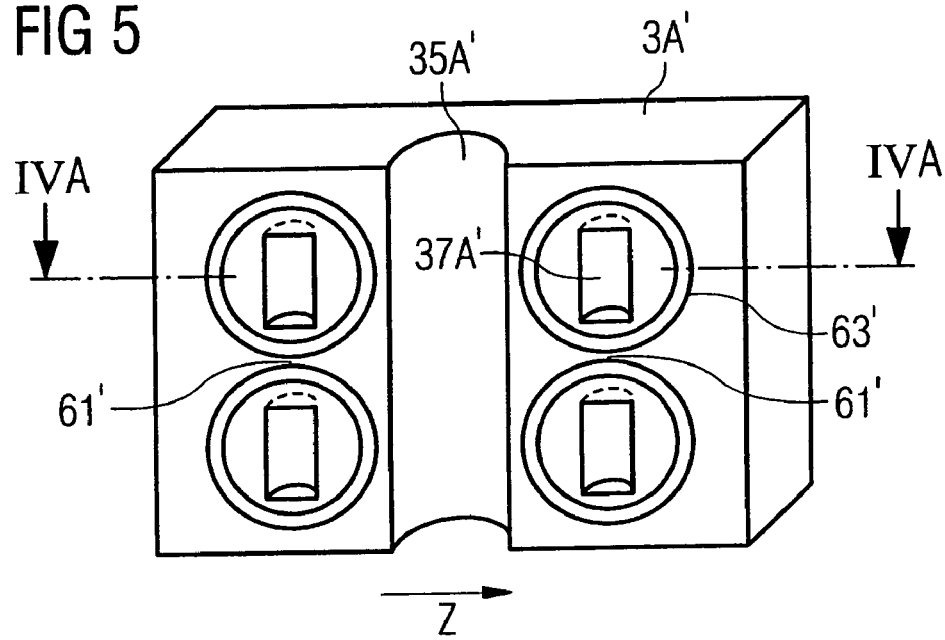
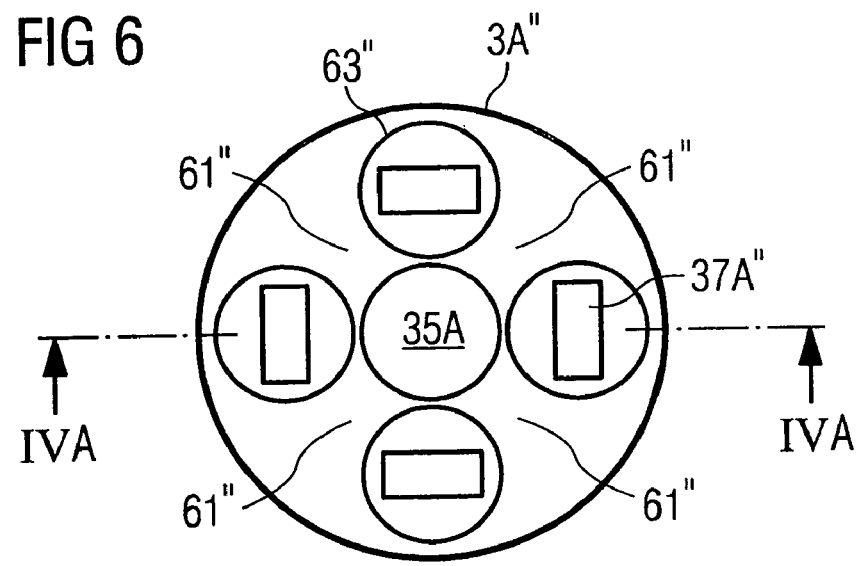

MAGNETIC RESONANCE APPARATUS WITH AN RF ANTENNA UNIT AND A GRADIENT COIL UNIT

BACKGROUND OF THE INVENTION

1. Field of the Invention

The present invention concerns a magnetic resonance apparatus of the type having an RF antenna unit, a gradient coil unit and an RF shield, the conductor structures of the gradient coil unit and the RF shield being independent of one another, the RF shield being arranged between the RF antenna unit and the gradient coil unit; with an RF field return (or field reflux) space existing between the RF antenna unit and the gradient coil unit, the RF field reflux space closing the RF magnetic field lines of the RF antenna unit and being bordered by the RF shield on the side of the gradient coil unit.

2. Description of the Prior Art

Magnetic resonance technology is a known modality for examination of subjects, among other things for the acquisition of images of the inside of a subject. Rapidly-switched gradient magnetic fields that are generated by a gradient coil system and serve for spatial coding are superimposed on a static basic magnetic field that is generated by a basic field magnet in an examination region of a magnetic resonance apparatus (MR apparatus, for example for MR tomography or MR spectroscopy). Furthermore, the MR apparatus has one or more radio-frequency antennas (RF antennas), one of which radiates RF signals into the examination subject to excite MR signals (usually a whole-body RF antenna) and another one (or more) of which acquires the emitted MR signals (usually a local antenna). One or more magnetic resonance images are generated based on the MR signals.

A MR apparatus in which eddy currents are compensated is known from U.S. Pat. No. 4,864,241. This ensues using gradient coils divided into two parts that typically form a hollow-cylindrical unit. An RF antenna with a smaller radius, likewise fashioned as a hollow cylinder, is introduced into the gradient coil unit for RF field generation.

From DE 44 14 371 A1, an MR apparatus is known in which a radio-frequency shield is arranged between the radio-frequency antenna and the gradient coil system, the radio-frequency shield being designed so that it is permeable for the electromagnetic fields generated by the gradient coil system in the low-frequency range and is impermeable for the fields generated by the radio-frequency antenna in the radio-frequency range.

Such a designed and allocated radio-frequency shield has the effect that the space lying between RF shield and radio frequency antenna unit forms an RF field return space, i.e. for closing of RF magnetic field lines. The RF magnetic field lines (ideally) proceed homogeneously in the acquisition region of the MR apparatus and are closed by the RF field return space. A high magnetic energy density that is too high in the RF field return space leads to disadvantageous interactions with, for example, the RF shield and increases the radiated power loss of the RF antenna unit.

A radio-frequency antenna of an MR apparatus can be designed, for example, as a type of antenna known as a birdcage antenna. A birdcage antenna is designed for generation of a homogeneous radio-frequency field within a volume normally enclosed by it, with longitudinal conductors that are connected with one another by ferrules arranged parallel to one another and equally spaced on an imaginary cylinder surface. Tuning ensues in the high-pass and low-pass filter ranges, by fixed capacitances connected in each of the conductors, or in the ferrules between the conductors, so that a homogeneous radio-frequency field results given resonant excitation. Embodiments of such a birdcage antenna are described, for example, in U.S. Pat. No. 4,680,548. The radio-frequency antenna also can be designed as an array antenna. The array antenna is formed by a number of essentially similar, mutually overlapping conductor loops. Embodiments of such an array antenna are described, for example, in U.S. Pat. No. 4,825,162. Such antennas also can be designed multi-staged, meaning that a number of antennas can be arranged next to one another and abutting one another.

From DE 42 30 145 A1, an MR apparatus is known that has a basic field magnet that allows a transversal access to the measurement volume. The MR apparatus has a gradient coil system with axially-separated segments. An axial RF coil system that can be inserted into an axial bore of a supporting body or transversally into the cavity of the basic field magnet is used for generation of an essentially homogenous RF field in the measurement volume. The MR apparatus, or the components thereof (such as the basic field magnet, the gradient coil system and the RF coil system) are designed with a view toward achieving an optimally large lateral access to the measurement volume for simplifying the implementation of therapy measures such as microsurgical procedures.

A transversal gradient coil arrangement is known from DE 44 22 782 C2 in which, in the gradient coils system, windings of the primary coil and the secondary coil that are farther from the center in the axial direction of the gradient coil arrangement exhibit a smaller radial interval relative to one another than windings lying closer to the center. This arrangement is intended to achieve an improved homogeneity of the magnetic field in the examination volume with the simultaneous possibility of shortening the coil. DE 44 22 782 C2 additionally describes a method for calculation of the conductor curve of such a gradient coil.

A sub-divided gradient coil unit for a magnetic resonance apparatus is known from WO 97/35214.

A magnetic resonance apparatus is known from DE 102 46 308 A1 having a hollow opening in which a gradient coil system, divided into two parts, is mounted for generation of gradient fields. The gradient coil system has two hollow-cylindrical halves between which is arranged a specially designed antenna system for transmission of radio-frequency signals and acquisition of magnetic resonance signals.

DE 198 51 584 C1 describes a gradient coil unit in which conductors of a primary gradient coil are electrically connected with conductors of the secondary gradient coil.

The technical development of MR apparatuses has arrived at a stage of maturity that places in the foreground, as a next step, the development of more compact systems with reduced cost. The greatest potential for cost reduction is to try to reduce the volume (diameter reduction) of the most complex component of the system, the basic field magnet. In order to enable this while still maintaining an adequately large acquisition volume, it is necessary to generate the dynamic fields of the MR apparatus (gradient and RF fields) by means of components that occupy as small a volume as possible.

SUMMARY OF THE INVENTION

It is an object of the invention to provide an MR apparatus in which an apparatus volume that surrounds the image data acquisition region of an examination subject can be kept to optimally small dimensions.

This object is achieved in accordance with the invention by an MR apparatus of the type initially described wherein the conductors of the gradient coil system occupy a first volume and wherein a second, conductor-free volume exists within the first volume on the side thereof facing the RF antenna unit, between a primary gradient coil unit and a second shim gradient coil unit of the gradient coil. The second conductor-free volume unit is at least partially surrounded by the conductor structure of the gradient coil unit, and forms a second RF field return space connected with the first RF field return space, by the RF shield proceeding between the RF field return spaces and the conductor structure of the gradient coil unit, with the RF antenna unit being closer to the data region of the magnetic resonance apparatus than the gradient coil unit.

The conductor-free space in the region of the gradient coil unit is inventively decoupled or isolated from the gradient coil unit in terms of radio-frequency and is designed as an expansion (extension) of the RF field return space. This is accomplished by the RF shield proceeding between the conductor structure and the second volume. This means that, for example, the RF shield deviates from its cylindrical shape in the case of a hollow-cylindrical gradient coil unit, or from its planar, flat shape in the case of a gradient coil unit of plate-like design of an open MR apparatus. These deviations are such that, for example, the RF shield arches into the gradient coil unit in order to enlarge (in terms of radio-frequency) the conductor-free second region that exists there. In the case of a hollow-cylindrical MR apparatus, the RF shield thus surrounds the acquisition region of the same length of the hollow cylinder. In the case of the open MR apparatus, the RF shield lies between the RF antenna unit and the gradient coil unit as a closed layer. In general, this means that the RF shield has no openings through which the RF field can pass through the gradient coil unit, so it represents a barrier (closed as a surface) of the RF field return space. No access (for example lateral) through the gradient coil to the acquisition regions for operative procedures is possible.

The invention has the advantage that, by the use of an additional conductor-free volume for the field return, overall the separation between the RF antenna unit and the gradient coil unit can be reduced without disadvantageously, significantly reducing the space available for the RF field return. This allows the units (RF antenna unit and gradient coil unit) to be inserted into the basic field magnet to be constructed in a space-saving manner and thus they can be dimensioned smaller, given the same patient acceptance volume of the basic field magnet, and therewith the same data acquisition volume, than is the case in a typical embodiment according to the prior art.

In MR apparatuses according to the prior art, RF and gradient coil units are optimized independently of one another. A compromise in terms of design is thereby selected for both units from the geometric requirements for an optimal field generation. Such a compromise does in fact fulfill the system requirements but requires a large space for the RF field return volume. For example, a larger radial separation between the RF antenna unit and the radio-frequency shield than is the case in the inventive MR apparatus results for a cylindrically-symmetrical MR apparatus.

For an integrated whole-body antenna units/gradient coil unit (see, for example, the subsequently published German patent application DE 10 2004 012 058.7, the invention exhibits a further advantage in that the conductor structures of the RF antenna unit, the gradient coil unit and the RF shield are designed independent of one another. An independent design of the conductor structures means that no double usage of electrical lines exists as in the case of the integrated body in which the RF shield alternating current source serves as a conductor of the RF antenna. A structural partitioning into an RF antenna unit and a gradient coil unit thus can be easily effected with an RF shield, such that given a defect or failure, only one of these units can be individually exchanged. In comparison with the integrated solution, an elaborate and expensive exchange of the integrated body is thus avoided.

Additional disadvantages with regard to the mechanical stability occur given the integration of whole-body antenna unit and gradient coil unit. This is not the case in accordance with the invention since the vibration-sensitive units can be arranged on their own carriers.

The vibration load of the RF antenna unit due to the oscillations of the gradient coil unit during the MR image acquisition is reduced to the (predominantly mechanical) decoupling. The use of elaborate connection techniques such as the connection of capacitors acting as fixed capacitances into the conductor structure of the RF antenna unit thus is also avoided.

The utilization of the first region for the return of the RF field extends the flexibility in the RF field formation in the data acquisition region, for example, to optimize the homogeneity range or to minimize the RF power radiated into in a patient. This is advantageous both with regard to the prior art according to FIG. 1 and in comparison with the aforementioned integrated whole-body antenna units/gradient coil units, since both are limited in terms of the space available for the RF field return volume.

It is particularly advantageous to arrange the additional field return volume given by the second region optimally close to the data acquisition region. For this purpose, the second region can be arranged in a central region of the first region with respect to an axial expansion of the first region. This can be achieved, for example, in a hollow-cylindrical MR apparatus by the use of a number of sub-coils in the direction of the cylinder axis, since these coils enable the provision of a conductor-free region in the plane of symmetry in the axial direction. In the case of a plate-shaped gradient coil unit, the second region can be groove-shaped in the plane of symmetry of the coils, or can be a depression in the center of the plate.

In a further embodiment, the second region tapers conically along a cylinder axis from the edge toward the middle of the first region. This has the advantage that conductors of the conductor structure of the gradient coil unit exhibit a minimal separation from the acquisition volume with a large gradient field efficiency. Given a cylindrical symmetry, conductor segments of the gradient coil unit that are more remote from the data acquisition volume are, for example, radially spaced away from the RF antenna unit and thus enable the formation of the additional RF field return space.

In another advantageous embodiment of the inventive magnetic resonance apparatus, the second conductor-free region is formed as a hollow space with at least one opening. In this embodiment, a conductor-free region can be used that, for example, is present in the space between the primary gradient coil unit and the secondary shim gradient coil unit. The aforementioned, conductor-free region can form the access to this hollow space-like region due to the use of a number of coils in the axial direction. In the case of a cylindrical MR apparatus, an annular, conductor-free region thus results that forms the access to a region with the gradient coil unit that forms an undercut. In the case of an open MR apparatus, a conductor-free region of the Z-gradient coil can be fashioned as an annular gap between two conductors proceeding circularly. Conductor paths as described in the aforementioned, subsequently-published patent application DE 10 2004 012 058.7 can lead to conductor-free regions for the X-and Y-gradient coils.

The RF shield preferably extends over the entire length of the gradient coil unit. For example, it can follow the inside of the hollow-cylindrical gradient coil unit in the outer region of a hollow-cylindrical MR apparatus and, in the inner region, it clads packets) the inside of one or more conductor-free regions to create the additional RF field return volume.

In a further embodiment of the invention, a conductor of the conductor structure of the RF antenna unit, for example a longitudinal conductor of a birdcage antenna, is widened so as to generate a correction capacitance dependent on the separation between the RF antenna unit and the RF shield. Alternatively, a planar conductor element aligned essentially parallel to the shield can be connected with the conductor structure of the RF antenna unit to generate a correction capacitance dependent on the separation between RF antenna unit and RF shield. Both embodiments have the effect that the parasitic capacity (dependent on the separation) of the RF resonator formed by the RF antenna unit increases in proportion to the fixed capacitance. The increase of such parasitic capacitances leads to a compensating effect of the separation-dependent capacitance and the separation-dependent inductance on the frequency properties of the RF resonator, such the center frequency and bandwidth of the RF field.

The additional, parasitic correction capacitances preferably used with a high voltage on the conductor. Furthermore, the phase of the local oscillation of the gradient coil unit, or in general the formation of the oscillation modes of the gradient coil unit, is able to be taken into account, since the amplitude of the separation change can also be spatially-dependent.

The correction introduced by separation-dependent, disadvantageous influences in the parallel arrangement of RF antenna units and gradient coil units is not limited to the previously-described inventive embodiment of the magnetic resonance apparatus, but rather can be used to reduce the dependency of the RF antenna unit on separation changes in any type of mechanical, oscillation-coupled RF antenna units with a conductor.

DESCRIPTION OF THE DRAWINGS

FIGS. 4A, 4B, 4C, 4D show exemplary embodiments of the invention, represented by schematic cross-sections through RF antenna units and gradient coil units.

FIG. 5 shows an unwound gradient coil unit for a hollow-cylindrical MR apparatus with a cross-section according to FIG. 4A.

FIG. 6 is a view of a plate-shaped gradient coil unit with a cross-section according to FIG. 4A.

DESCRIPTION OF THE PREFERRED EMBODIMENTS

Figure 1:
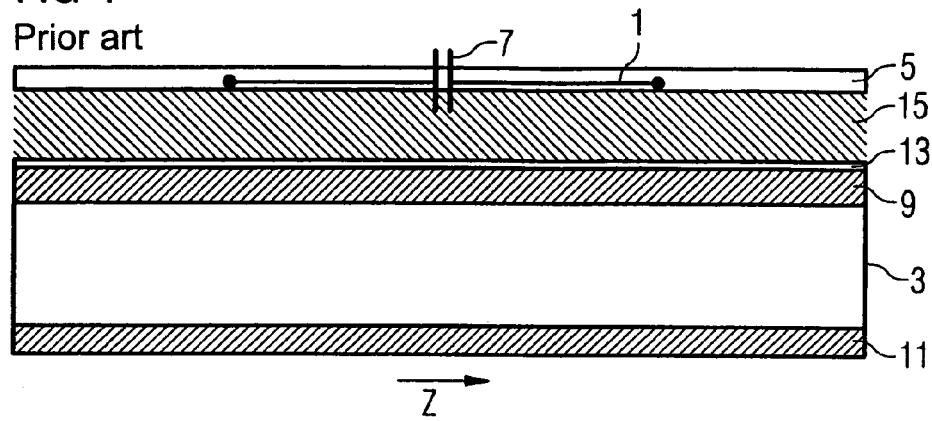
FIG. 1 is a section through an RF antenna unit and a gradient coil unit according to the prior art.

In a cross-section, FIG. 1 shows the arrangement and shape of an RF antenna unit 1 and a gradient coil unit 3 as are typical in the prior art. For stability reasons, the RF antenna unit 1 is typically mounted on an inner cladding 5 serving as a carrier.

An RF resonator of the RF antenna unit 1 is exemplified by a capacitor 7. The gradient coil unit 3 has conductor structures of the primary gradient coil 9 and the second gradient coil 11 for shielding (shim coil). The thickness of the gradient coil unit 3 lines in the range of 10 cm. In the prior art, the units generating RF fields and gradient fields typically are optimized independently of one another. For an optimal field generation, a compromise that fulfills the system requirements is typically selected for both units from the geometric requirements. For example, a radial separation of 3.5 cm between the reception device antenna unit 1 and the gradient coil unit 3 results for a hollow-cylindrical MR apparatus. For suppression of eddy currents and interference fields due to the RF field in the gradient coils 3, 11, the gradient coil unit 3 is protected from inflow of RF fields by an RF shield 13 on the side facing the RF antenna unit 1. An RF field return volume 15 on the region between the RF antenna unit 1 and the RF shield 13 is thus limited.

In the case of a hollow-cylindrical MR apparatus, the section direction indicated by Z corresponds with the direction along the cylinder axis and, in the case of a plate-shaped MR apparatus, with a section through the center of the plate-shaped units.

Figure 2:
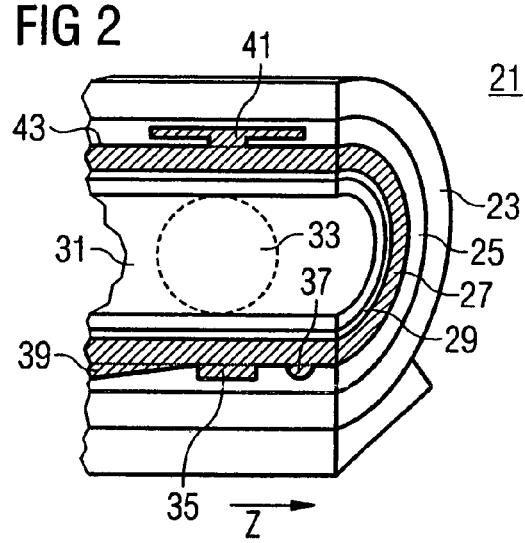
FIG. 2 is a section through a hollow-cylindrical magnetic resonance apparatus.

FIG. 2 shows an inventive hollow-cylindrical MR apparatus 21 with the following components arranged radially inwardly from the exterior: a superconducting basic field magnet 23 in a vacuum vessel, a gradient coil unit 25, an RF field return volume 27, and an RF antenna unit 29 having an interior formed by an inner lining 31. An acquisition region 33 into which a patient to be examined is introduced for image acquisition is located inside these components fashioned as hollow cylinders.

The basic requirement for MR excitation is an optimally homogeneous basic magnetic field generated by the basic field magnet 23 in the acquisition region 33. For excitation of MR response signals, RF fields are radiated into the acquisition region 33 with the RF antenna unit 29. A spatial coding of the resulting MR signals from the acquisition region 33 is achieved by gradient fields generated in the acquisition region 33 by gradient coils of the gradient coil unit 25.

Various possible embodiments of conductor-free regions in the gradient coil unit 25 are shown in FIG. 2. A volume 35 lies between axially-separated gradient coils of the gradient coil unit 25 and is annularly located in the middle of the gradient coil unit 25. An asymmetrical conductor-free volume 37 as well as a volume 39 tapering conically from the outside toward the middle are likewise shown. The region 39 preferably surrounds a ferrule of the RF antenna unit 29. A further possible embodiment of the conductor-free volume is a volume 41 lying between the primary and secondary gradient coils. The indicated regions 35, . . . 41 are lined on their inner side by a radio-frequency shield 43. The additionally-achieved field return volume in the regions 35, . . . 41 enables a compact arrangement of gradient coil unit 25 and the RF antenna unit 29 so that, in comparison with the prior art, the basic field magnet 23 can be made smaller (and therewith, for example, more cost-effectively) while maintaining the acquisition region 33 the same size as in conventional apparatuses. Alternatively, the acquisition region 33 can be made larger given a basic field magnet 23 of the same size.

Figure 3:
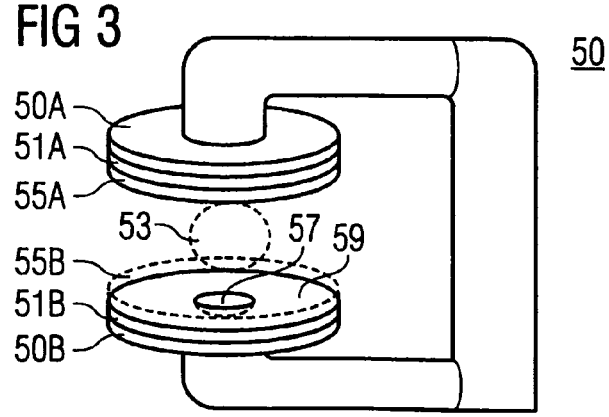
FIG. 3 is a schematic representation of an open MR apparatus.

FIG. 3 shows an open MR apparatus 50 with two opposing gradient coil units 51A, 51B that are plate-shaped and arranged above and below an acquisition region 53. Plate-shaped RF antenna units 55A, 55B are disposed parallel to the gradient coil units 51A, 51B. Apart from the different geometry, the design and the functionality essentially correspond to those of the MR apparatus of FIG. 2.

The lower RF antenna unit 55B is indicated dashed in order to make visible the surface modulation of the side of the gradient coil unit 51 B facing the RF antenna unit 55B. A disc-shaped, conductor-free volume 57 can be seen in the center of the gradient coil unit 51B. An RF shield 59 applied on the gradient coil unit 51A lines the region 57, such that the field return volume between the RF antenna unit 55B and the gradient coil unit 51B exhibits a sufficient volume despite the small separation of the two units.

The exemplary embodiments shown in FIGS. 2 and 3 achieve the previously-described object of a compact geometry of an MR apparatus wherein RF and gradient fields are generated with independently-positioned conductor structures. Due to the commonly-implemented optimization of the conductor structures, they exhibit a smaller separation from one another than is the case given separate optimization of the gradient coil unit and the RF antenna unit. The commonly implemented optimization enables a type of geometric impression of the RF fields on the RF shield that, in terms of its curvature, is not yet optimized for and adapted to the conductor-free regions. In the optimization, the side of the gradient coil unit facing the RF antenna unit is optimized. Conductor-free regions are thereby created at locations that can be used as an RF field return volume and thereby have the effect that the return of the RF field encounters an optimally slight magnetic resistance. Optimization parameters for a low power requirement are typically the characteristic variables of the homogeneity volume as well as coil efficiency. The mechanical stability of the necessary geometry is additionally taken into account; this can occur, for example, by a comparative harmonic oscillation analysis. Furthermore, the necessary coil resonant frequency and the usable axial expansion of the return volume associated with this coil resonant frequency are accounted for.

Conductor regions of maximum gradient field efficiency are preferably at a minimum distance from the acquisition region in the configuration of the gradient coil unit. For this purpose, the current density distribution on the gradient coil surface is mathematically formulated so that its resulting gradient magnetic field can be represented either as a function of its Fourier coefficients or as a function of magnetic dipoles on the current density surface. For a given target field, this function is optimized with a variation method at suitable points in the coil volume, using, for example, a minimum gradient strength and gradient inductance are required as boundary conditions. Contour lines (curves) of the resulting optimized current density distribution that are acquired in this manner are used for generation of the conductor trace layout. A detailed description of such a calculation method is, for example, provided in the previously-cited patent document DE 44 22 782 C2.

The determination of a surface geometry meeting the requirements can occur iteratively, i.e. an optimal structure for RF purposes is used as an input variable for the gradient coil optimization. A change in the geometry, which is analyzed as to its influence on the RF antenna unit, is derived from the results of the first iteration. The iteration loop is ended as soon as a parameter set meeting the requirements has been found for both participating components.

If, for example, additional annular RF field return volume (similar to the conductor-free region 37 in FIG. 2) is available in a birdcage resonator in the region of the ferrules, a low number of conducting webs through the RF field return space can be selected as a starting point of an iterative calculation. These webs enable a more efficient design of the current density for the transversal gradient axes. In the course of the iterative method, the number of "return pockets RFTs" lying between the webs can vary, for example from a minimum of 4 to a maximum of 32. The number of the RFTs is in principle dependent on the number of the longitudinal conductors of the birdcage antenna located within the gradient coil. A higher number of longitudinal conductors is generally connected with a higher RF field homogeneity. The usable axial expansion of the (first) RF field return volume decreases with increasing coil resonant frequency, such that additional (second) RF field return volume gains importance, particularly in radio-frequency MR apparatuses.

Due to the indispensable inner cladding tube as a "spacer" between the patient and the RF structure for demarcation of the specific absorption rate (SAR), the same space yield can be achieved with an inventive MR apparatus as with an integrated whole-body antenna unit/gradient coil unit, meaning that the separation between RF antenna unit and the gradient coil unit can be reduced, for example, from approximately 4 cm to approximately 1 cm.

Advantages of the inventive embodiments attained, for example, according to the method just described are the prevention of stressing of the RF antenna unit by vibrations of the gradient coil unit, a slight weakening of the mechanical stability of the gradient coil unit (in comparison to the integrated embodiment of RF antenna unit and gradient coil unit), the ability to exchange the RF antenna unit or the gradient coil unit in a simple manner in the case of failure or upgrade, and avoiding additional complexity of the RF resonator given higher basic field strengths or RF frequencies.

FIGS. 4A through 4D show cross-sections of various embodiments of the inventive arrangement and design of RF antenna unit, RF shield and gradient coil unit. The cross-sections can be associated with both hollow-cylindrical MR apparatuses (section through a hollow cylinder wall) and open MR apparatuses (section through a plate-shaped arrangement).

FIG. 4A shows a gradient coil unit 3A the primary gradient coil 9A of which has both a conductor-free volume 35A in the center and smaller conductor-free regions 37A that are disposed between the central conductor-free volume 35A and the edge of the gradient coil unit 9A, for example in the region of the ferrules of the RF antenna unit 1A. An RF shield 13A lines the conductor-free volumes 35A, 37A that extend at least partially into the intervening volume between the primary gradient coil 9A and the secondary gradient coil 11A. For example, the thickness of the gradient coil unit 3A lies in the range of 10 cm and the separation between the RF antenna unit 1A and the gradient coil unit 3A is, for example, 1 cm. Periodic webs with gradient coil conductors can be arranged within the additional RF field return space 37A, for example in the circumferential direction, for a more efficient gradient field generation.

FIG. 4B shows a design in which the second RF field return volume is gained by a central conductor-free region 35B that continues relatively far into the intervening region of primary and secondary gradient coils 9B and 11B. In order to be able to retain a "planar" gradient coil conductor structure at least in sections, the primary coil has been conically executed in two parts, meaning that it approaches the RF antenna unit 1B from the edge of the gradient coil unit 3B in the direction of the center of the gradient coil unit 3B. A further conductor-free volume 37B that conically tapers towards the middle represents the difference in the shape of the gradient coil unit 3B in comparison with, for example, a purely hollow-cylindrical embodiment.

A simple criterion for determination of a suitable surface structure of a gradient coil of a gradient coil unit is the available RF field return volume of the RF antenna unit. In a conventional case, a cross-sectional area of, for example, 0.028 m$^2$ results for the example shown in FIG. 1. Given a radial gain of 3 cm, the embodiment according to FIG. 4B with a central ring gap of the width of 12 cm and a radius difference of the cone of 4 cm exhibits a cross-sectional area that is only approximately 30% smaller.

A further embodiment is shown in FIG. 4C. The gradient coil unit 3C is conductor-free internally and the central conductor-free region 35C represents an opening to the inside of the gradient coil unit 3C. The additionally-gained field return volume thus corresponds to a hollow volume 37C with an opening.

The gradient coil units 3A and 3B of FIGS. 4A and 4B have the advantage of a force-fit connection in the radial direction between primary and secondary coils 9A, 11A and 9B, 11B, such that relative oscillations are prevented in operation. The optimization of the RF return volume can ensue such that the mechanical and RF requirements are fulfilled. The oscillation behavior of the gradient coil unit 3C according to FIG. 4C can be stabilized by introduction of an RF field-compatible filling material.

FIG. 4D is an embodiment wherein a central conductor-free region 35D is fashioned as a passage through the gradient coil unit 3D into a further conductor-free volume, the field return volume 41D. The field return volume 41D is essentially bordered by the gradient coil unit 3D and a basic field magnet 23D/50D and is closed, in terms of radio-frequency, up to the passage by the two parts of the RF shield 13DA and 13DB. The RF shield 13DB at the basic field magnet 23D/50D also can be formed by its metallic wall, which approaches the RF shield 13DA so far that a radio-frequency seal is effected. In a specific embodiment, the basic field magnet 23D/50D exhibits a barrel-like or spherical segment-shaped recess so that a gradient field homogenization is effected in the acquisition volume due to currents induced in the metallic wall by the gradient field, and thus a secondary gradient coil for shielding can be dispensed with.

FIGS. 5 and 6 show exemplary views of an unrolled hollow-cylindrical (FIG. 5) or a plate-shaped gradient coil unit (FIG. 6). In the shown embodiments with cross-sections similar to FIG. 4A, it can be seen that the additionally-gained field return volumes 37A', 37A" are interrupted by webs 61', 61" in order to enable a more flexible conductor trace run 63', 63" of the gradient coil conductor structure.

Figure 7:
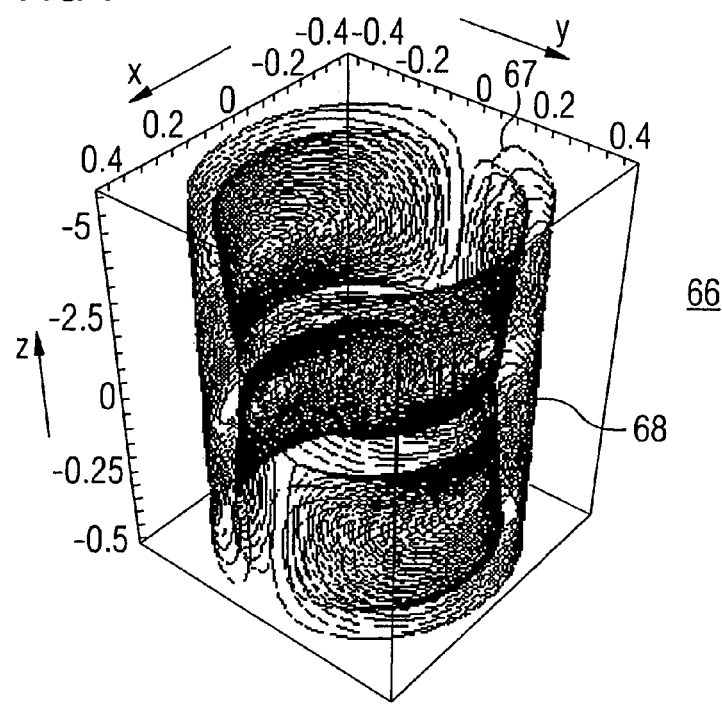
FIG. 7 is a projection of a three-dimensional conductor structure of a gradient coil unit with a conical inner wall and a central ring gap, with a cross-section according to FIG. 4B.

With reference to FIG. 4B, FIG. 7 shows a projection of a three-dimensional conductor structure of a gradient coil unit with a conical curvature of the primary gradient coil 67 and a central ring gap as well as a cylindrical secondary gradient coil 68. Given a target field deviation of less than 10%, such gradient coil unit achieves a field efficiency of 125 µT/A/m in an ellipsoidal acquisition region of 19×19×14 cm$^3$. The discretization of the continuous current density allows a conductor trace (run) width of 5 mm. Given a direct current resistance of 180 mΩ, the gradient coil unit exhibits an inductance of 950 µH.

The already-mentioned alternative approach from DE 44 22 782 C2 realizes the RF and gradient conductor structures on a common coil body (integrated concept). It has been shown that a radially-symmetrical gap in the center of the cylindrical carrier structure has no negative influence on the gradient field efficiency given specific boundary conditions. Here the negative influence of the mechanical stability of the coil carrier due to wear or disconnection is problematic. The vibration load of the RF conductor structure arranged on the same coil body is additionally increased due to the vibrations of the gradient conductors in imaging operation. Due to the insertion of capacitors (necessary in principle) into the RF conductor structure, correspondingly elaborate connection techniques are therefore necessary in order to ensure a fatigue strength. In the event of failure, the elaborate (in comparison to a separately-fashioned RF antenna unit) exchange of the whole is necessary. Furthermore, the principle of the hollow volume resonator (connected with cavities in the coil body) requires more complex RF hollow space geometries that can only be realized in a complicated manner. In comparison with this, the inventive design is significantly more flexible, in particular with regard to the formation of RF antenna units in radio-frequency MR apparatuses (>3T).

Figure 8:
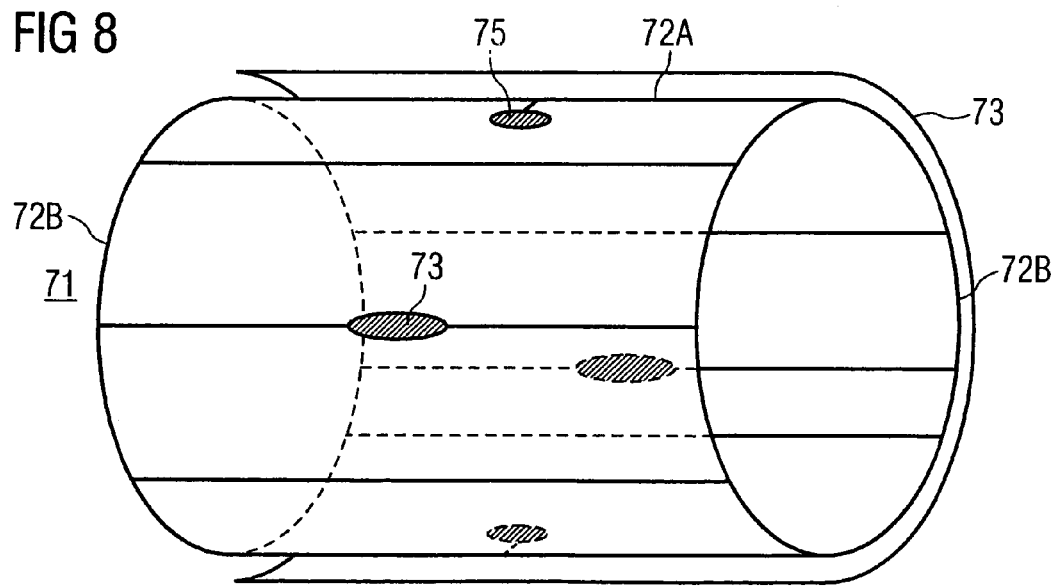
FIG. 8 shows an exemplary conductor structure of a RF antenna unit in the form of a birdcage resonator with correction capacitances in the form of widened conductors and electrically-connected small circuit boards.

In the inventive MR apparatus, for example, a birdcage resonator formed by one or multiple stages can be used as an RF conductor structure of the RF antenna unit. Such an easily modified RF antenna unit 71 is shown in FIG. 8:

The birdcage resonator 71 with longitudinal conductors 72A and ferrules 72B is surrounded by an RF shield 73. In the event of a mechanical oscillation of the RF shield 73 or of the RF antenna 71, the separation of conductors of the birdcage antenna 71 from the RF shield 73 changes. This has the effect of a change of the parasitic capacity and inductivity of such an antenna design. Capacitance and inductance are influenced in opposite manners: given a reduction of the gap thickness, for example, the inductivity is smaller, however the parasitic capacitance between the conductors and the shield is greater. The influence is reverse propagation to the separation, such that it particularly has an effect in the inventive formation of MR apparatuses since these enable a very close design of separately-supported conductor structures of RF shield and RF antenna unit. The temporal change of inductance and capacitance have an effect on the resonant frequency; for example vibration-dependent interferences of the phase of the emitted RF signals and the acquired MR signals occur. Such a vibration sensitivity of RF resonant circuits is known as "microphony".

The embodiment of the RF antenna unit of the MR apparatus described below has the goal of compensating for interferences due to such separation changes.

The sensitivity relative to small separation changes can be reduced by a specific division of the capacitance of the RF resonator into capacitances oncentrated in solid capacitors, and specifically-applied parasitic capacitances (correction capacitances). Among other things, the frequency bandwidth can thereby also be increased. For this, in a first step the magnetic design of the RF resonator (separation and length) is provided. In a second step, the parasitic, separation-dependent capacitance of the RF resonator is linked to the value necessary for compensation of the microphony by variation of the width of, for example, the longitudinal conductors 72A (see, for example, conductor trace widenings 73) or via connection of additional capacitive, planar conductor elements 75 (for example made from small copper plates) that are aligned substantially parallel to the RF shield 73. This means that the separation-dependent influence of the inductivity on the frequency characteristic of the RF antenna unit is compensated by the separation-dependent influence of the parasitic capacity. For this purpose, the conductor widenings or correction capacities are attached in regions of potential loops (antinodes), i.e. near fixed capacitors at which the electrical field strength is most pronounced. In a third step, the remaining capacitance still missing for RF resonance is inserted in the form of one or more discrete capacitors.

In the distribution of the correction capacitance, it can additionally be taken into account that the amplitude of the separation change is spatially-dependent (for example given higher mechanical oscillation modes of the gradient coil unit). For example, if the deflection under the RF potential loop is greater than under the current antinode, the correction capacities must be made correspondingly smaller.

As already mentioned, these measures are not limited to the use of an RF antenna unit in an inventive MR apparatus, but rather can be used in every RF antenna unit of an MR apparatus with vibration-conditional interferences of the frequency characteristic due to induction and capacitor changes.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus having a data acquisition region, and comprising:
   an RF antenna unit;
   a gradient coil unit disposed relative to said RF antenna unit with a side of said gradient coil unit facing said RF antenna unit, said gradient coil unit comprising conductors and including a primary gradient coil and a secondary gradient coil, said conductors occupying a region;
   an RF shield disposed between said RF antenna unit and said gradient coil unit, said RF shield having conductors that are independent of the conductors of the gradient coil unit;
   said RF antenna unit and said gradient coil unit defining a first RF field return volume therebetween for closing RF magnetic field lines of the RF antenna unit, said first RF field return volume being bordered by said RF shield at said side of said gradient coil unit facing said RF antenna unit;
   said gradient coil unit having a conductor-free region being at least partially surrounded by said region occupied by the conductors of the gradient coil unit at said side facing said RF antenna unit, between said primary gradient coil and said secondary gradient coil, said conductor-free region forming a second RF field return volume communicating with said first RF field return volume, with said RF shield proceeding between said first and second RF field return volumes and said conductors of said gradient coil unit; and
   said RF antenna unit being disposed closer to said data acquisition region than said gradient coil unit.

2. magnetic resonance apparatus as claimed in claim 1 wherein said region occupied by said conductors of said gradient coil unit has a hollow-cylindrical shape.

3. A magnetic resonance apparatus as claimed in claim 1 wherein said region occupied by said conductors of said gradient coil unit has a plate shape.

4. A magnetic resonance apparatus as claimed in claim 1 wherein said region occupied by said conductors of said gradient coil unit has an axial extent, and wherein said conductor-free region is disposed substantially centrally within said region occupied by said conductors of said gradient coil unit along said axial extent.

5. A magnetic resonance apparatus as claimed in claim 1 wherein said region occupied by said conductors of said gradient coil unit has an axial extent, having edges and a middle, and wherein said conductor-free region tapers conically from one of said edges toward said middle.

6. A magnetic resonance apparatus as claimed in claim 1 wherein said conductor-free volume comprises a hollow volume having at least one opening.

7. A magnetic resonance apparatus as claimed in claim 1 comprising a basic bid magnet within which said data acquisition region Is disposed and having an exterior at which said gradient coil unit Is disposed, and wherein said gradient coil unit has a passage therein leading to a further conductor-free region between said basic field magnet and said gradient coil unit, said passage forming a radio frequency connection to said further conductor-free region and said further conductor-free region being dosed In terms of radio frequency, and said RF shield comprising a first part and a second part, said first part preventing entry of RF fields into said gradient coil unit and said second part preventing entry of RF fields into said basic field magnet.

8. A magnetic resonance apparatus claimed In claim 7 wherein said basic field magnet has a wail at said exterior forming said second part of said RF shield.

9. A magnetic resonance apparatus as claimed in claim 1 wherein said RF antenna unit comprises a bird cage antenna, and wherein said conductors of said RF antenna unit comprise longitudinal conductors proceeding substantially parallel to said cylinder axis.

10. A magnetic resonance apparatus as claimed in claim 9 wherein said bird cage antenna is a multi-stage bird cage antenna.

11. A magnetic resonance apparatus as claimed in claim 9 wherein one of said longitudinal conductors is wider than a remainder of said longitudinal conductors, to generate a correction capacitance dependent on a separation between said RF antenna unit and said RF shield.

12. A magnetic resonance apparatus as claimed in claim 9 comprising a planar conductor element disposed substantially parallel to said RE shield, and wherein one of said longitudinal conductors is electrically connected to said planar conductor element to generate a correction capacitance dependent on a separation between said RF antenna unit and said RF shield.

13. A magnetic resonance apparatus as claimed in claim 1 wherein one of said conductors of said RF antenna unit is wider than a remainder of the conductors of said RE antenna unit, to generate a correction capacitance dependent on a separation between said RF antenna unit and said RF shield.

14. A magnetic resonance apparatus as claimed in claim 1 comprising a planar conductor element disposed substantially parallel to said RF shield, and wherein one of said conductors of said RF antenna unit is electrically connected to said planar conductor element to generate a correction capacitance dependent on a separation between said RF antenna unit and said RF shield.

15. A magnetic resonance apparatus as claimed in claim 1 wherein said gradient coil unit generates a gradient field, and wherein said RF shield is substantially permeable to said gradient field and substantially impermeable to an RF field generated by said RF antenna unit.

16. A magnetic resonance apparatus as claimed in claim 1 wherein the respectively independent conductors of said RF antenna unit and said gradient coil unit allow independent assembly and disassembly of said RF antenna unit and said gradient coil unit with respect to each other.

* * * * *